United States Patent
Costa et al.

(10) Patent No.: US 6,521,961 B1
(45) Date of Patent: Feb. 18, 2003

(54) SEMICONDUCTOR DEVICE USING A BARRIER LAYER BETWEEN THE GATE ELECTRODE AND SUBSTRATE AND METHOD THEREFOR

(75) Inventors: Julio Costa, Phoenix, AZ (US); Ernest Schirmann, Phoenix, AZ (US); Nyles W. Cody, Tempe, AZ (US); Marino J. Martinez, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/560,737

(22) Filed: Apr. 28, 2000

(51) Int. Cl.[7] ............................................. H01L 31/06
(52) U.S. Cl. .................. 257/402; 257/35; 257/42; 257/73; 257/183; 257/201; 257/268; 257/269; 257/471; 257/472; 257/475; 257/192
(58) Field of Search ........................... 257/35, 54, 73, 257/183, 201, 268–9, 402, 471–2, 475, 192

(56) References Cited

U.S. PATENT DOCUMENTS

| | | | |
|---|---|---|---|
| 4,942,058 A | * 7/1990 | Sano | 427/431 |
| 5,164,800 A | * 11/1992 | Nakajima | 257/194 |
| 5,451,548 A | 9/1995 | Hunt | 437/225 |
| 5,484,740 A | 1/1996 | Cho | |
| 5,525,538 A | * 6/1996 | Twigg et al. | 437/105 |
| 5,550,089 A | 8/1996 | Dutta | 437/225 |
| 5,597,768 A | 1/1997 | Passlack | 437/236 |
| 5,663,584 A | * 9/1997 | Welch | 257/288 |
| 5,665,658 A | 9/1997 | Passlack | 438/763 |
| 5,789,760 A | * 8/1998 | Irikawa et al. | 257/15 |
| 5,821,171 A | 10/1998 | Hong | 438/767 |
| 5,844,261 A | 12/1998 | Kuo et al. | |
| 5,902,130 A | 5/1999 | Passlack | 438/604 |
| 5,904,553 A | 5/1999 | Passlack | 438/590 |
| 5,945,718 A | 8/1999 | Passlack | 257/410 |
| 6,025,281 A | 2/2000 | Passlack | 438/779 |
| 6,140,169 A | * 10/2000 | Kawai et al. | 438/197 |
| 6,144,048 A | * 11/2000 | Suemitsu et al. | 257/192 |
| 6,159,861 A | * 12/2000 | Asai et al. | 438/706 |
| 6,198,116 B1 | * 3/2001 | Cerny et al. | 257/194 |

FOREIGN PATENT DOCUMENTS

EP  0 323 220 A  7/1989

OTHER PUBLICATIONS

Fujita, S., et al, "Barrier Height Lowering of Schottky Contacts on AlInAs Layers Grown by Metal–Organic Chemical–Vapor Deposition", J. Appl. Phys. 73 (3), 1284–1287 (1993).*

(List continued on next page.)

*Primary Examiner*—Nathan J. Flynn
*Assistant Examiner*—Johannes P Mondt
(74) *Attorney, Agent, or Firm*—Kim-Marie Vo

(57) ABSTRACT

An enhancement mode semiconductor device has a barrier layer disposed between the gate electrode of the device and the semiconductor substrate underlying the gate electrode. The barrier layer increases the Schottky barrier height of the gate electrode-barrier layer-substrate interface so that the portion of the substrate underlying the gate electrode operates in an enhancement mode. The barrier layer is particularly useful ill compound semiconductor field effect transistors, and preferred materials for the barrier layer include aluminum gallium arsenide and indium gallium arsenide.

6 Claims, 2 Drawing Sheets

OTHER PUBLICATIONS

Pilkington, S.J., et al, "Thermally Stability of Epitaxial Aluminum on In0.53Al0.47As Schottky Diodes Grown by Molecular Beam Epitaxy", J. Appl. Phys. 83 (10), 5282–5288 (1998).*

Chen K J et al: "High–Performance INP–Based Enhancement–Mode Hemt's Using Non–Alloyed OHMIC Contacts and PT–Based Buried–Gate Technologies", IEEE Transactions on Electron Devices, IEEE Inc., New York, US, vol. 43, No. 2, Feb. 1, 1996, pp. 252–257, XP000589313.

Wolf, "Silicon Processing for the VLSI Era, vol. 2: Process Integration," Lattice Press, Sunset Beach, CA, pp. 143–147 (1990).

M. Passlack, M. Hong, J.P. Mannaerts, R.L. Opila, S.N.G. Chu, N. Moriya, F. Ren and J.R. Kwo, "Low $D_{it}$, Thermodynamically Stable $Ga_2O_3$–GaAs Interfaces: Fabrication, Characterization, and Modeling," *IEEE Transactions On Electron Devices*, vol. 44, No. 2, pp. 214–225, Feb. 1997.

* cited by examiner

SEMICONDUCTOR DEVICE USING A BARRIER LAYER BETWEEN THE GATE ELECTRODE AND SUBSTRATE AND METHOD THEREFOR

BACKGROUND

The present invention relates to semiconductor devices in general and more particularly to a semiconductor device using a barrier layer between the gate electrode and the semiconductor substrate of the device.

Wireless devices such as cellular phones are continually requiring higher efficiency power amplifier improvements. Current cellular phones generally use a power field effect transistor (FET) for controlling power consumption. In a radio frequency (RF) power amplifier, such as a metal semiconductor FET (MESFET) used in a cellular phone, the maximum power that the power transistor in the amplifier is capable of supplying is determined by the highest input power that causes the transistor to become forward-biased. The gate voltage at which the transistor becomes forward biased is primarily determined by the characteristics of the gate metal and semiconductor interface, which is directly related to the Schottky barrier height of the interface.

Current power transistors, for example as used in high performance cellular phones, are typically heterostructure devices using gallium arsenide. However, such devices typically become forward biased at fairly low gate voltages, for example about 0.5 volts. It would be preferable if such devices became forward biased only at voltages substantially greater than 0.5 volts. In order to achieve such greater voltages, the barrier height of the device would need to be increased.

In addition to the above, the MESFETs and high electron mobility transistors (HEMTs) typically used in power amplifiers in high performance cellular phones are depletion-mode devices, which have a negative threshold voltage, and require that the cellular phone include the extra components of a negative voltage generator, extra capacitors to work with the generator, and a p-type metal oxide semiconductor (PMOS) transistor drain switch to more completely shut off power consumption that occurs due to leakage of the power transistor. Such leakage may result in incomplete turn-off of the power amplifier and increased battery or other power supply usage. An advantage, however, of such depletion-mode devices is that they exhibit high saturation drain current, low on-resistance, and high gain.

In contrast to depletion-mode devices, enhancement-mode FETs do not require the extra components above. However, the performance of such enhancement-mode devices is not as desirable as that of the depletion-mode devices. It would be desirable to have a power transistor that combines the performance benefits of depletion-mode devices with the positive threshold voltage of enhancement devices. This would eliminate the extra physical area and expense associated with the extra components described above.

Accordingly, there is a need for a semiconductor device for use in RF power amplifier applications that becomes forward biased at substantially higher gate voltages than current depletion-mode devices and that operates in an enhancement mode.

DETAILED DESCRIPTION OF THE PREFERRED EMBODIMENTS

The present invention generally provides a semiconductor device including a barrier layer disposed between the gate electrode of the device and a channel layer in the semiconductor substrate underlying the gate electrode. The barrier layer increases the Schottky barrier height of the gate electrode-barrier layer-substrate interface so that the portion of channel layer underlying the barrier layer operates in an enhancement mode.

In a preferred approach, the barrier layer for the transistor is formed by selective formation of the barrier layer in a dielectric layer opening formed overlying the substrate and in which the gate electrode of the transistor is subsequently formed. Many different materials may be used as the barrier layer, as presented in more detail below. In general, these materials will be suitable for lattice matching to the underlying, supporting semiconductor layer, which may be for example aluminum gallium arsenide, in the transistor. These materials also will exhibit a high barrier height relative to the material forming the channel layer of the transistor.

Device Structure

Figure 1:
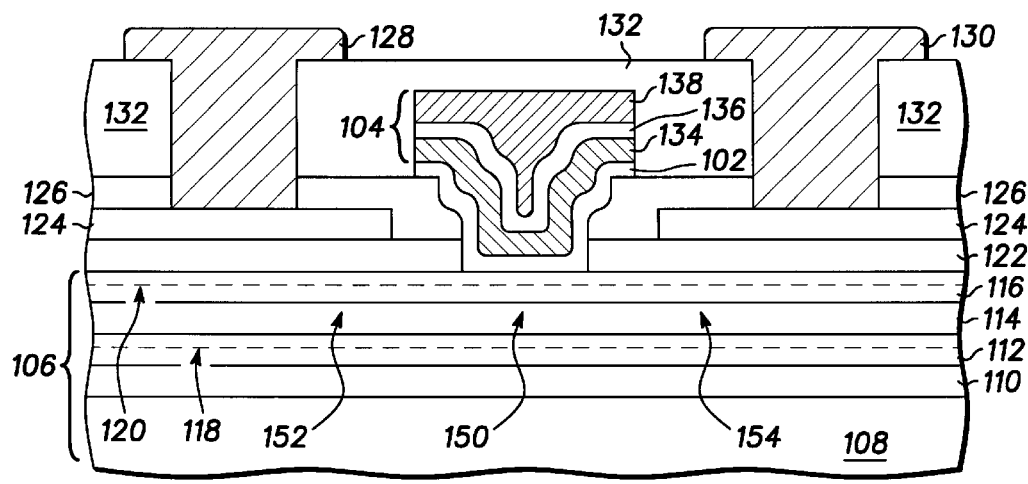
FIG. 1 illustrates a semiconductor device according to the present invention.

The above features of the present invention are described below with reference to specific embodiments as illustrated in the figures listed above. More specifically, as shown in FIG. 1, according to the present invention, a semiconductor device 100 is formed on a semiconductor substrate 106, which preferably comprises several compound semiconductor layers formed on a compound semiconductor wafer 108, such as, for example, a semi-insulating gallium arsenide wafer. Device 100 is illustrated as a HEMT, and more specifically a psuedomorphic HEMT (P-HEMT), but the barrier layer of the present invention could be used in another type of device such as, for example, a MESFET, a heterostructure FET, or an insulated gate FET (IGFET).

The compound semiconductor layers of substrate 106 include, for example, buffer layer 110, aluminum gallium arsenide (AlGaAs) layer 112, indium gallium arsenide (InGaAs) current channel layer 114, and AlGaAs layer 116. Buffer layer 110 is, for example, AlGaAs or au AlGaAs super lattice. Typically, substrate 106 is sold in an intermediate manufactured form as described in the foregoing text for further processing by the purchaser. AlGaAs layers 112 and 116 have, for example, an aluminum (Al) concentration of about 25%. InGaAs layer 114 has, for example, an aluminum (Al) concentration of about 12–25%.

Gate layer 104 is formed overlying substrate 106 to provide a gate electrode for device 100, and according to the present invention, barrier layer 102 is formed between gate layer 104 and substrate 106. Gate layer 104 comprises, for example, metal layer 134, gold layer 136, and plated gold layer 138, all formed as described below.

Barrier layer 102 is provided to raise the barrier height of device 100 sufficiently to raise the threshold voltage of device 100 above zero volts. The preferred barrier height is between about 0.5 to 5 electron volts (eV), and more preferably between about 1 to 10 eV. It should be noted that the most preferred barrier height is as high as can be achieved with the selected barrier material and other materials used to form device 100. As an example, for a barrier layer material of AlGaAs with an Al concentration of about 75% manufactured as described below, it is expected that the barrier height of the manufactured device will be about 1.5 eV. As another example, suitable gallium oxide barrier materials are expected to have a barrier height of about 2 to 5 eV. As a point of comparison, silicon oxide generally exhibits a barrier height of about 8–10 eV.

The material selected for forming barrier layer 102 will preferably provide a barrier height in the preferred ranges described above. Examples of suitable materials for barrier layer 102 include aluminum gallium arsenide (with, for example, about 50 to 75% Al concentration), indium gallium arsenide, gallium oxides (for example, $GaO_3$) that preferably will lattice match with gallium arsenide materials, or a phosphide compound. Other materials that may also be suitable include quarternary or other ternary compounds that will lattice match with gallium arsenide or the other semiconductor materials that may be used to form device 100.

Barrier layer 102 preferably has a thickness less than about 500 angstroms, and more preferably less than about 150 angstroms. It is believed that barrier layer 102, for example, can have a thickness of about 50–100 angstroms. Barrier layer 102 should form an interface with its underlying, supporting layer, which is layer 116 in device 100, that has a low density of defects. Barrier layer 102 is preferably lattice matched to the supporting layer.

According to the present invention, barrier layer 102 is formed by a blanket growth/deposition process in which the portions of barrier layer 102 which will be lattice matched largely correspond to the local regions on the surface of substrate 106 that are exposed by an opening 300 (see FIG. 3) in layer 122 and over which gate layer 104 is later formed.

InGaAs layer 114 provides a high mobility current channel for current flow in device 100. This channel charge is provided by the conventional use of silicon delta doping in layers 112 and 116 as indicated by arrows 118 and 120. This channel charge alternatively could be provided by thin uniformly-doped layers. According to the present invention, the portion 150 of the current channel in substrate 106 disposed directly beneath gate layer 104 is formed to operate in an enhancement mode. It should be noted that the enhancement mode portion 150 of channel layer 114 is substantially free of implanted ions, as would be required for other conventional processes in order to achieve enhancement mode operation. The other portions 152 and 154 of the current channel in substrate 106 formed adjacent to and on opposite sides of portion 150 are formed to operate in a depletion mode, as discussed further below.

As will be discussed further below, barrier layer 102 is formed in an opening formed during manufacture in recess layer 122 so that a portion of barrier layer 102 is in contact with substrate 106. Recess layer 122 is an undoped semiconductor layer such as, for example, undoped gallium arsenide with a thickness of about 200–500 angstroms. Gate layer 104 is later formed overlying barrier layer 102 in this same opening.

Source contact or electrode 128 and drain contact or electrode 130 are formed in contact with contact layer 124, which is preferably heavily-doped n-type (N+) gallium arsenide. Electrodes 128 and 130 are the current terminals and gate layer 104 is the control terminal of device 100. Electrodes 128 and 130 are isolated from gate layer 104 by dielectric layer 126, which is formed for example of silicon nitride, and inter-level dielectric (ILD) 132, which may be a conventional tetra-ethyl-orthosilicate (TEOS) ILD. As is conventional with a P-HEMT, recess layer 122 is preferably an epitaxial layer that is not implanted or otherwise doped.

Contact layer 124 is preferably an epitaxial layer that has been heavily doped.

Device 100 is operated by biasing gate layer 104 to control the current flow through portion 150 of the current channel in layer 114, which operates in an enhancement mode as mentioned above. Operation in an enhancement mode generally means that the threshold voltage is greater than zero volts. The current flow passes through portions 152 and 154 of layer 114, which operate in a depletion mode. Portion 150 is described as operating in an enhancement mode because the introduction of barrier layer 102 raises the barrier height due to the depletion of carriers from portion 150 of the channel. Portions 152 and 154 of layer 114 are described as operating in a depletion mode because these portions are not located underneath barrier layer 102 and thus have not had the carriers depleted from these regions by the presence of barrier layer 102.

By the use of barrier layer 102, the threshold voltage of device 100 is increased to greater than zero volts, and more preferably to greater than about 0.3 to 0.5 volts, and the turn-on voltage of the gate-substrate diode is significantly increased, for example to greater than about 2 volts. Thus, the gate voltage at which device 100 becomes forward biased is advantageously increased.

The semiconductor device of the present invention may be advantageously used in high frequency and high efficiency RF power applications, including for example cellular telephone and base station applications. Because the device operates in an enhancement mode, an additional negative voltage supply generator (along with its extra capacitors) and a drain switch are not necessary.

Manufacture

Figure 2:
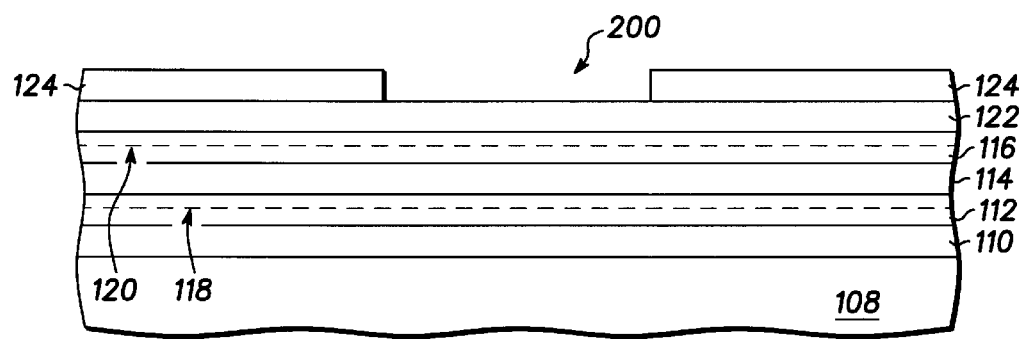
FIGS. 2–6 illustrate sequential steps in the manufacture of the semiconductor device of FIG. 1.

FIGS. 2–6 illustrate sequential steps in the manufacture of semiconductor device 100 of FIG. 1. Common reference numbers are used for common elements. As shown in FIG. 2, manufacture typically begins with a conventional compound semiconductor wafer 108 having several III–V epitaxial layers formed on the wafer's surface, for example, by molecular beam epitaxy (MBE) or metal organic chemical vapor deposition (MOCVD). These layers comprise buffer layer 110, AlGaAs layer 112, InGaAs layer 114, AlGaAs layer 116, recess layer 122, and contact layer 124. Wafer 108 is commercially available with the foregoing layers formed thereon and is the conventional starting material for the formation of a conventional P-HEMT device. The wafer is available with delta doping of silicon as discussed above for arrows 118 and 120 or alternatively with thin uniformly-doped layers as mentioned above. The manufacturing process begins by forming an opening 200 (in order to accommodate the later formation of gate layer 104) in contact layer 124 using a conventional etching process.

Figure 3:
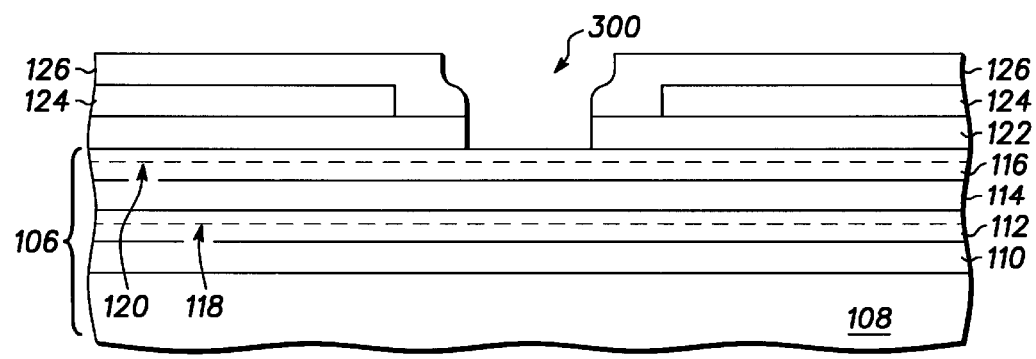

In FIG. 3, dielectric layer 126 is formed across the surface of wafer 108 (including into the previously-formed opening 200), and an opening 300 is formed in layer 126 that extends down through recess layer 122 to expose a portion of the surface of substrate 106. Opening 300 may be formed using conventional photoresist and etch process steps. Gate layer 104 will later be formed in opening 300. The width of opening 300 is, for example, about 0.25 to 1 micron.

Figure 4:
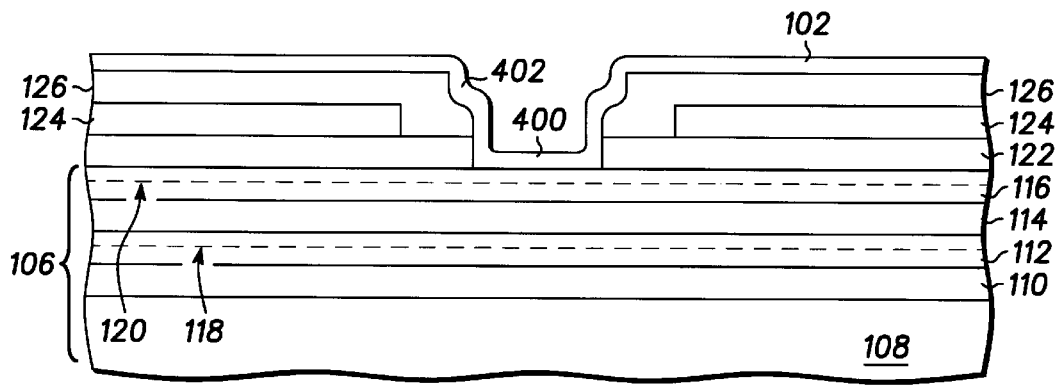

In FIG. 4, barrier layer 102 is formed as a blanket layer across the surface of wafer 108 and a portion 400 of barrier layer 102 extends into opening 300 (see FIG. 3) during formation. Portion 400 of barrier layer will exhibit a substantially lattice-matched interface with AlGaAs layer 116, but portion 402 in contact with dielectric layer 126 will have an amorphous structure.

Barrier layer 102 is preferably formed by MOCVD or MBE using conventional techniques appropriate for the material selected for use as the barrier layer. Typical temperatures for this MBE or MOCVD processing are about 500 to 700 degrees centigrade (° C.). For example, when forming a barrier layer of gallium oxide, a conventional MBE technique using a gadolinium (Gd)-based source may be used to form the gallium oxide layer. It should be noted that MBE is preferred over MOCVD when forming a barrier layer of gallium oxide.

Figure 5:
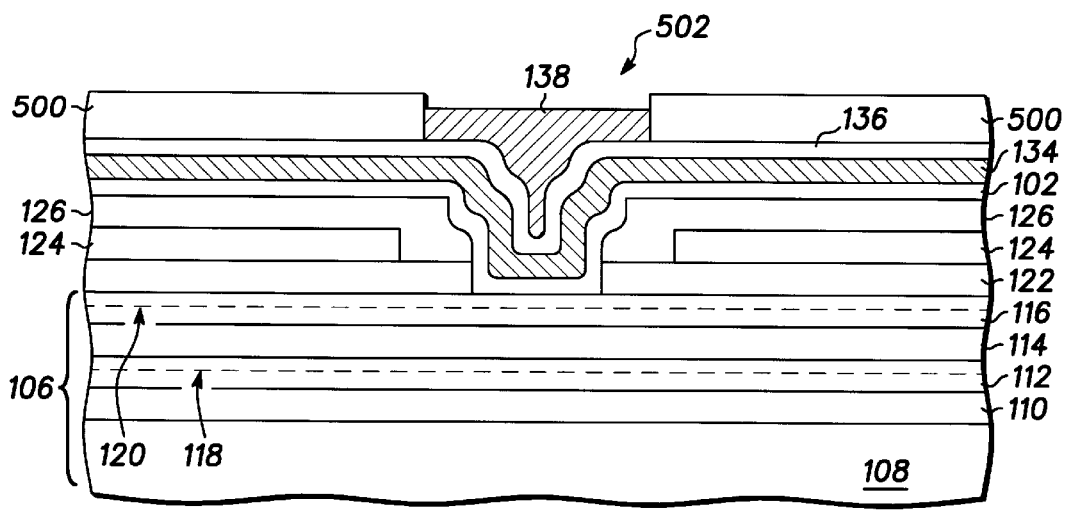

In FIG. 5, the formation of gate layer 104 begins with the formation of a metal layer 134 of, for example, titanium tungsten or tungsten silicide using conventional processing. Next, thin gold layer 136 is formed by a conventional sputtering process. Then, photoresist layer 500 is formed and patterned to form an opening 502. Plated gold layer 138 is plated onto the exposed portions of thin gold layer 136 using a conventional electroplating process. This particular process for forming a gate structure is conventionally known as a "T-gate" formation process.

Figure 6:
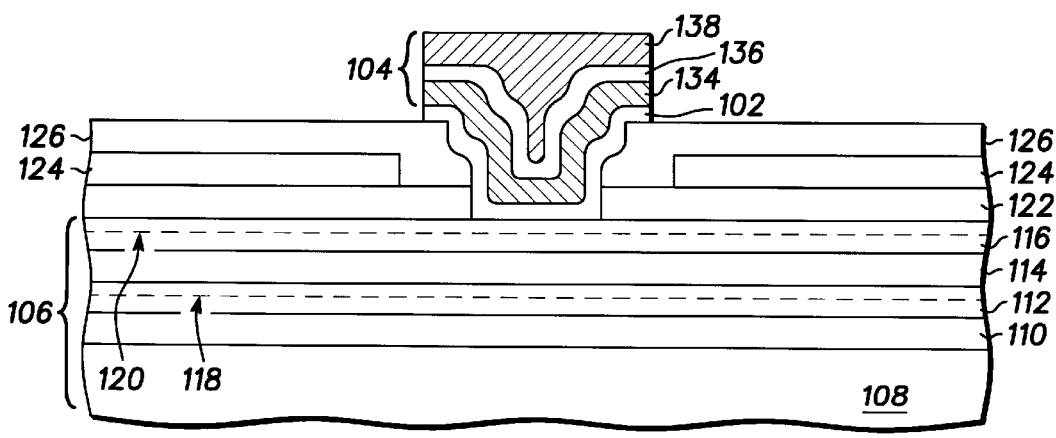

In FIG. 6, photoresist layer 500 is removed, and a conventional gold etching process is used to remove those portions of thin gold layer 136 that were exposed by removal of photoresist layer 500, which also slightly etches back plated gold layer 138.

Next, a conventional dry etch, for example, is used, with plated gold layer 138 acting as a mask, to remove those portions of metal layer 134 and barrier layer 102 not underlying plated gold layer 138. This leaves some portions of dielectric layer 126 exposed.

Again referring to FIG. 1, to complete the manufacture of device 100 a conventional inter-level dielectric 132 is formed overlying wafer 108. Contact openings are formed in inter-level dielectric 132 and dielectric layer 126, and source contact 128 and drain contact 130 are formed using conventional processing. It should be noted that gate layer 104 is preferably formed before source contact 128 and drain contact 130 since typical gallium arseinde-based devices use contacts including gold, which has a relatively low melting point. By forming the contacts after the gate layer, the formation of barrier layer 102 may be done at the higher temperatures, for example, required for typical epitaxial growth. It should be noted, however, that conventional refractory ohmic contacts could be formed either before or after gate layer 104 due to their higher melting points.

It should be noted that as a result of the foregoing manufacturing process, barrier layer 102 is patterned to form a plurality of discrete portions, each of which is partially formed in an opening in recess layer 122 between gate layer 104 and substrate 106. Each discrete portion corresponds to a single gate layer, and each semiconductor wafer or die used in forming device 100 typically contains several gates. The discrete portions result from etching away those portions of barrier layer 102 that are not disposed in the region immediately around gate layer 104.

Advantages

By the foregoing, a novel and unobvious semiconductor device, and method of manufacture and use therefor, using a barrier layer between the gate electrode and semiconductor substrate of the device to increase the barrier height of the device has been disclosed by way of preferred embodiments. An important advantage is that the device can be operated as an enhancement-mode transistor. Further, the device of the present invention exhibits low access resistance and the method thereof eliminates the need for implants and anneal cycles, as is required for typical GaAs transistors formed by ion implantation, and which would otherwise tend to degrade the quality of the MBE or MOCVD epitaxial layers of the substrate. Moreover, the practice of the present invention permits the source and drain ohmic contacts to be placed directly over N+ doped layers, which is difficult to achieve with present, conventional enhancement mode technologies.

Other Variations

Although specific embodiments have been described above, numerous modifications and substitutions may be made without departing from the spirit of the invention. For example, while the description of preferred embodiments above has been presented for the specific embodiment of an HEMT, other device structures may benefit from the practice of the invention. Although the present invention has been illustrated and described above with respect to a GaAs-based transistor, it should be noted that the present invention can be implemented in other semiconductor-based transistors such as, for example, InP-based, gallium nitride (GaN)-based, or silicon carbide (SiC)-based transistors. Accordingly, the invention has been described by way of illustration rather than limitation.

What is claimed is:

1. The semiconductor device wherein a first portion of the barrier layer is lattice-matched to the semiconductor substrate and a second portion of the barrier layer has an amorphous structure.

2. The semiconductor device of claim 1 wherein the barrier layer has a thickness less than about 150 angstroms.

3. The semiconductor device of claim 1 wherein the barrier layer is formed of at least one of the materials selected from the group consisting of aluminum gallium arsenide, indium gallium arsenide, a quarternary compound, a tenary compound, gallium oxide, and a phosphide compound.

4. The semiconductor device of claim 1 wherein the barrier height is between about 0.5 to 5 electron volts.

5. The semiconductor device of claim 1 wherein:
the semiconductor substrate comprises a compound semiconductor wafer and an epitaxial layer overlying the wafer; and
the epitaxial layer is in contact with the barrier layer.

6. A compound semiconductor device, comprising:
a semiconductor substrate comprising a channel layer;
a gate layer overlying the channel layer;
wherein a first portion of the channel layer substantially free of implanted ions and disposed underlying the gate electrode operates in an enhancement mode and a second portion of the channel layer disposed adjacent to the first portion operates in a depletion mode; and
a barrier layer disposed only between the gate layer and the semiconductor substrate.

* * * * *

UNITED STATES PATENT AND TRADEMARK OFFICE
CERTIFICATE OF CORRECTION

PATENT NO.   : 6,521,961 B1
DATED        : February 18, 2003
INVENTOR(S)  : Costa et al.

It is certified that error appears in the above-identified patent and that said Letters Patent is hereby corrected as shown below:

<u>Column 6,</u>
Line 32, replace "The" with -- A --
Line 32, between the words "device" and "wherein" please insert the following text:

-- comprising:
    a semiconductor substrate comprising a current channel;
    a gate electrode overlying the current channel;
    a barrier layer disposed between the gate electrode and the semiconductor substrate, wherein the barrier layer increases the barrier height of the current channel in the region of the semiconductor substrate underlying the barrier layer sufficiently to raise the threshold voltage of the semiconductor device above zero volts; and --

Signed and Sealed this

Fourteenth Day of October, 2003

JAMES E. ROGAN
*Director of the United States Patent and Trademark Office*